United States Patent [19]

Iwahashi

[11] Patent Number: 4,937,700

[45] Date of Patent: Jun. 26, 1990

[54] SEMICONDUCTOR INTEGRATED CIRCUIT WITH A CIRCUIT LIMITING AN INPUT VOLTAGE TO A PREDETERMINED VOLTAGE

[75] Inventor: Hiroshi Iwahashi, Yokohama, Japan

[73] Assignee: Kabushiki Kaisha Toshiba, Kawasaki, Japan

[21] Appl. No.: 290,945

[22] Filed: Dec. 28, 1988

[30] Foreign Application Priority Data

Jan. 7, 1988 [JP] Japan .................................. 62-63739

[51] Int. Cl.$^5$ .............................................. H02H 3/20
[52] U.S. Cl. ........................................ 361/91; 361/56; 361/111; 357/23.13
[58] Field of Search ..................... 361/56, 86, 91, 111; 351/23.13

[56] References Cited

U.S. PATENT DOCUMENTS

| | | | |
|---|---|---|---|
| 4,419,747 | 12/1983 | Jordan | 365/201 |
| 4,451,903 | 5/1984 | Jordan | 365/94 |
| 4,580,063 | 4/1986 | Torelli et al. | 361/56 |
| 4,802,054 | 1/1989 | Yu et al. | 361/91 |

*Primary Examiner*—Derek S. Jennings
*Attorney, Agent, or Firm*—Finnegan, Henderson, Farabow, Garrett and Dunner

[57] ABSTRACT

A semiconductor integrated circuit includes an input terminal and a first circuit responsive to a signal supplied to the input terminal. An input voltage limiting circuit is further provided between the input terminal and the first circuit. The input voltage limiting circuit limits a voltage applied to the first circuit to a predetermined voltage.

21 Claims, 2 Drawing Sheets

SEMICONDUCTOR INTEGRATED CIRCUIT WITH A CIRCUIT LIMITING AN INPUT VOLTAGE TO A PREDETERMINED VOLTAGE

BACKGROUND OF THE INVENTION

1. Field of the Invention

The present invention relates to a semiconductor integrated circuit, and more particularly to a semiconductor integrated circuit having a circuit which, when an input voltage externally applied thereto is higher than a predetermined voltage, limits the input voltage to the predetermined voltage and then applies the limited input voltage to an internal circuit.

2. Description of Related Art

A semiconductor integrated circuit has a plurality of input terminals for receiving input signals which are externally applied. In some types of integrated circuits, some of those input terminals serve as test signal input terminals used for a testing of the integrated circuit, for example. When a test mode setting signal is applied to the test signal input terminals, the semiconductor circuit is in a test mode.

An IC package in which the semiconductor integrated circuit is packed is larger in size as the number of pins thereof is larger. The price of the large IC package rises and it is difficult to make small a circuit block using such ICs. Therefore, it is more desirable that the number of the input terminals is small. Conversely, when the number of pins used is limited, it is desirable to use the external pins as effectively as possible, in order to bring about many functions of the IC package used. As a result, one input terminal is used for receiving both an ordinary input signal and a test mode setting signal.

In such semiconductor integrated circuit, an input circuit for detecting an ordinary input signal such as a TTL level and a high voltage detection circuit for detecting a test mode setting signal at a high voltage, are both connected to one input terminal. The input circuit is capable of outputting a logic "0" or "1" level signal according to the potential of the ordinary input signal. In the case that the voltage of an input signal ranges between 0V and 5V, a switching threshold of the input circuit is typically near +1.5V in order to respond to standard TTL input voltages. When the ordinary input voltage is lower than +1.5V, the output of the input circuit is a logic "0". When the ordinary input voltage is higher than +1.5V, the output of the input circuit is a logic "1". The high voltage detection circuit detects a test mode setting signal of 12V, for example. The high voltage detection circuit have a very high switching threshold, e.g., +9V. When the input voltage is lower than +9V, the output of the high voltage detection circuit is a logic "0". When the input voltage is higher than +9V, the output of the high voltage detection circuit is a logic "1". Accordingly, when a test mode setting signal of 12V is applied to the input terminal, the high voltage detection circuit generates a high voltage detection signal of a logic "1". When the high voltage detection signal is a logic "1", the semiconductor integrated circuit is in a test mode. When the test mode setting signal at a high voltage is not applied to the input terminal, the high voltage detection circuit generates a logic "0" signal. When the test mode setting signal at a high voltage is not applied to the input terminal, the semiconductor integrated circuit is not set in a test mode, and operates in a normal mode.

MOS transistors in the semiconductor integrated circuits have become smaller and smaller in recent years in order to achieve higher integration densities and to reduce costs. Progress in microfabrication necessitates the thinning of the gate insulating films of the MOS transistors formed on a semiconductor chip. The reason for this is that the shorted channel length of the MOS transistor resulting from microfabrication needs a thin gate insulating film, in order to keep good transistor characteristics. But the thinner gate insulating film causes the lower breakdown voltage of the gate insulating film. In the case of microfabricated semiconductor integrated circuits, therefore, there is a danger that the high voltage test mode setting signal applied to the input terminal may damage the gate insulating film of the MOS transistor in the input circuit.

At present, MOS transistors whose gate insulating film is 200Å thick has been successfully developed and gradually put into practice. When a high voltage of 12V, for example, is applied to the gate of such a transistor, an electric field applied to the gate insulating film reaches 6MV/cm. Under such an electric field, no breakdown of the gate insulating film of the transistor might occur but degradation of the insulating performance of the gate insulating film would inevitably occur. Variance in the process parameters in the manufacturing stage of semiconductor integrated circuits would cause defects in the gate insulating films of the manufactured transistors. Such defective gate insulating films would be damaged by supplying the 12V voltage.

The breakdown problem of the gate insulating film may easily be solved by lowering the voltage value of the test mode setting signal. This measure, however, creates the following problem. When the voltage value of the test mode setting signal is lowered, the switching threshold to define the logic "0" and "1" levels in the high voltage detection circuit must also be lowered, in order to detect the lowered voltage of the test mode setting signal. This results in decreasing the difference between the switching threshold of the input circuit and that of the high voltage detection circuit. With such a decreased difference, when the input signal voltage instantaneously rises due to noise for example, the high voltage detection circuit may mistakenly recognize that input signal as a test mode setting signal, so that the semiconductor integrated circuit operating in a normal mode would be mistakenly set in a test mode. The input signal is inevitably accompanied by an overshoot. The overshoot is particularly high when the input signal abruptly rises. If the switching threshold of the high voltage detection circuit is low, such a large overshoot would also be mistakenly detected as a test mode setting signal. For the above reasons, the use of a low test mode setting voltage is undesirable.

As described above, the approach in which one input terminal is used for two circuits with different switching thresholds involves difficulties in practical use due to the above problems: the breakdown of the gate insulating film of the transistor, and the erroneous operation of the high voltage detection circuit.

SUMMARY OF THE INVENTION

Accordingly, an object of the present invention is to provide a semiconductor integrated circuit which is suitable for microfabrication.

Another object of the present invention is to provide a semiconductor integrated circuit which allows a single input terminal to be used for two circuits with different switching thresholds, while remaining free of erroneous operations.

To achieve the above objects, there is provided a semiconductor integrated circuit comprising:
an input terminal;
a first circuit responsive to a signal supplied to the input terminal; and
a voltage limiting circuit for limiting a voltage applied to said first circuit to a predetermined voltage, the voltage limiting circuit being inserted between said input terminal and said first circuit.

With such an arrangement, the voltage limiting circuit prevents a voltage exceeding the predetermined voltage from being applied to the first circuit. No breakdown of the gate insulating film of the MOS transistor occurs, and improvement of the packing density may be attained.

The semiconductor integrated circuit according to the present invention further comprises a second circuit having a detecting voltage higher than a detecting voltage of the first circuit for detecting a binary state of the input signal of said input terminal.

With the above feature, the voltage limiting circuit prevents a voltage exceeding the predetermined voltage from being applied to the first circuit. The voltage at the input terminal is directly applied to the second circuit. Therefore, the detecting voltage of the second circuit may be set much higher than the detecting voltage of the first circuit. Consequently, even in microfabricated integrated circuits, one input terminal may be used for two different circuits having different detecting voltages in use for determining a binary state of the input signal, logic "0" or "1", without any degradation of reliability of the integrated circuits.

DETAILED DESCRIPTION OF THE PREFERRED EMBODIMENTS

Figure 1:
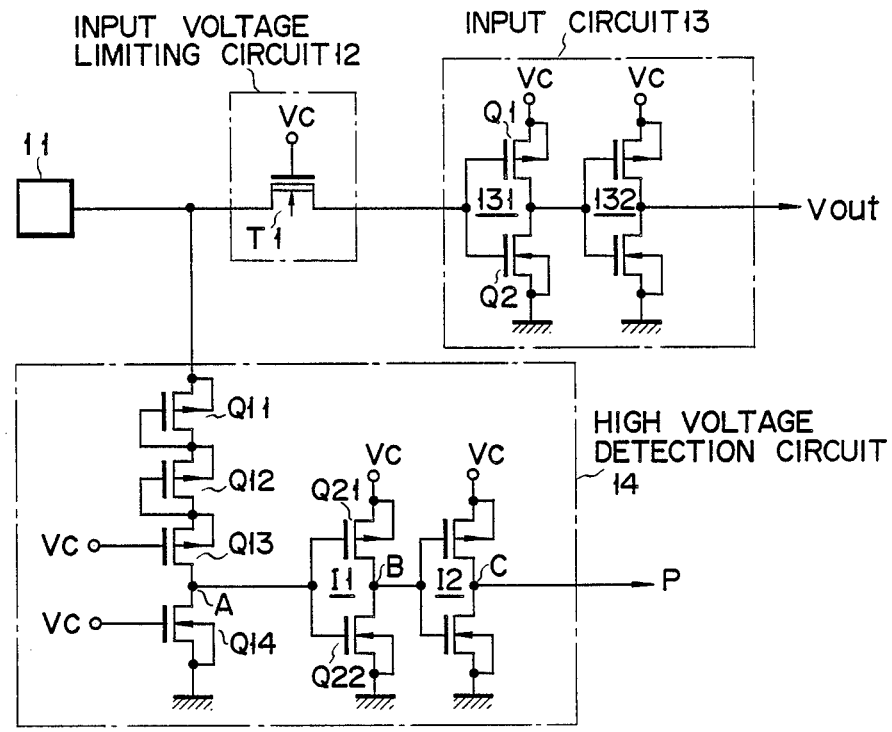
FIG. 1 is a circuit diagram showing a semiconductor integrated circuit according to a first embodiment of the present invention.

FIG. 1 shows a semiconductor integrated circuit according to a first embodiment of the present invention. In the circuit, input terminal 11 receives a normal input signal such as a TTL level signal, and a test mode setting signal for setting a test mode in the integrated circuit. When the integrated circuit is in a normal mode, an ordinary input signal of 5V is applied to input terminal 11. To set the integrated circuit in a test mode, a test mode setting signal of 12V is applied to the input terminal. Input terminal 11 is connected to input circuit 13 through input voltage limiting circuit 12. The voltage limiting circuit 12 limits an input voltage applied to input circuit 13 to a predetermined voltage, to prevent a voltage exceeding the predetermined voltage from being applied to input circuit 13.

Input voltage limiting circuit 12 comprises an N channel depletion mode MOS transistor T1. The drain of the transistor T1 is connected to input terminal 11. The source of the transistor T1 is connected to the input node of input circuit 13. The gate of the transistor T1 is connected to a power voltage VC (e.g., +5V) terminal. Input circuit 13 detects the logic state of an ordinary input signal supplied to input terminal 11. When an input signal is less than +1.5V, input circuit 13 produces an output signal Vout of a logic "0". When it is more than +1.5V, the input circuit 13 produces an output signal Vout of a logic "1". The output signal Vout is supplied to an internal circuit (not shown).

The input terminal 11 is also connected to high voltage detection circuit 14. This circuit 14 detects a test mode setting signal at a high voltage, e.g., +12V. When the high voltage test mode setting signal is applied to the input terminal 11, high voltage detection circuit 14 produces a detection signal P of a logic "1". When such a high voltage signal is not applied, it produces signal P of a logic "0". More exactly, when the input signal is less than +9V, high voltage detection circuit 14 produces the signal P of a logic "0". For more than +9V, it produces the signal P of a logic "1". The detection signal P is supplied to a internal circuit. When the signal P is a logic "1", the internal circuit is in a test mode.

In the semiconductor integrated circuit thus arranged, the voltage limited by input voltage limiting circuit 12 is applied to input circuit 13. Assuming that the threshold voltage of transistor T1 is Vth1, input voltage limiting circuit 12 limits the input voltage which is applied to the input circuit 13, to a voltage of (VC−Vth1).

In the case that, for example, power source voltage VC is 5V and threshold voltage Vth1 is −2V, the limited voltage is $$VC - Vth1 = 5V - (-2V) = 7V.$$

Accordingly, even if a test mode setting signal of 12V is applied to the input terminal 11, the voltage applied to the input node of input circuit 13 never rises above 7V. Let us consider a potential difference between the gate and drain of transistor T1. It is assumed now that the voltage applied to input terminal 11 is 12V, and power source voltage VC is 5V. The potential difference between the gate and drain is: $12V - 5V = 7V$. The potential difference is equal to the voltage applied to the input circuit 13. Consequently, also in this transistor T1, the gate insulating film is not damaged. The voltage applied to the gate of transistor T1 may be lower than power source voltage VC. For example, the gate of transistor T1 may be connected to the connection point of two resistors connected in series between the power source voltage VC terminal and the ground terminal. In this case, if the voltage applied to the gate of transistor T1 is VG, the input voltage limiting circuit 12 limits the input voltage of the input circuit 13 to (VG−Vth1). At this time, a potential difference between the gate and drain of transistor T1 becomes larger than that when power source voltage VC is applied to the gate of transistor T1. For this reason, the gate voltage VG of transistor T1 must be selected to be such a value as not to damage the gate insulating film of transistor T1. N channel depletion mode MOS transistor T1 may be substituted by an N channel enhancement mode MOS transistor. When the gate of this transistor is connected to the power source terminal VC, and its threshold voltage Vth2 is set at 1V, the input voltage of input ccircuit 13 is limited to 4V, because $VC-Vth2=5V-1V=4V$.

Input circuit 13 comprises CMOS inverters 131 and 132 connected in a cascade fashion. CMOS inverter 131 as a first stage includes P- and N-channel MOS transistors Q1 and Q2. The voltage limited by input voltage limiting circuit 12 is applied to the gates of those transistors Q1 and Q2. Therefore, the gate insulating film of each transistor is not damaged.

The voltage at input terminal 11 is directly applied to the high voltage detection circuit 14, without any limitation. High voltage detection circuit 14 detects a test mode setting signal of 12V.

High voltage detection circuit 14 comprises P-channel enhancement mode MOS transistors Q11 to Q13, N-channel enhancement mode MOS transistors Q14, and CMOS inverters I1 and I2. The source of transistor Q11 is connected to input terminal 11. The gate and drain of the transistor Q11 are both connected to the source of transistor Q12. The gate and drain of transistor Q12 are connected to the source of transistor Q13. The gate of transistor Q13 is connected to the power source voltage VC terminal. The drain of transistor Q13 is connected to the drain of N-channel MOS transistor Q14. The gate and source of this transistor Q14 are respectively connected to the power source voltage VC terminal and a ground terminal. Connection node A of transistors Q13 and Q14 is connected to an input node of CMOS inverter I1. Output node B of CMOS inverter I1 is connected to an input node of CMOS inverter I2. The CMOS inverter I2 generates the detection signal P of this high voltage detection circuit 14.

In high voltage detection circuit 14, the voltage at input terminal 11 is reduced by an absolute value of the threshold voltage of transistor Q11 by means of this transistor Q11, and applied to the source of transistor Q12. Similarly, the source voltage of transistor Q12 is reduced by an absolute value of the threshold voltage of transistor Q12 by means of this transistor Q12, and applied to the source of transistor Q13. Transistor Q13 is turned on when its source voltage is higher than power source voltage VC by an absolute value of the threshold voltage of transistor Q13, and turned off when it is below the threshold voltage. Transistor Q14 is always in an ON state.

Accordingly, when the voltage applied to the input terminal 11 is higher than the total of the sum of the absolute values of the threshold voltages of transistors Q11 to Q13, and the power source voltage VC, the logic state at node A changes from a logic "0" to a logic "1". Consequently, the logic state at output node B of inverter I1 changes from a logic "1" to a logic "0", and that at output node C of inverter I2 changes from a logic "0" to a logic "1". When the voltage at node C, i.e., detection signal P, is a logic "1", this semiconductor integrated circuit is in a test mode.

In high voltage detecting circuit 14, the gate insulating film of each transistor will not be damaged even if a voltage of 12V is applied to input terminal 11. The reason for this will be described using a case of the threshold voltage of each of transistors Q11, Q12 and Q13 being at $-1V$.

When the test mode setting signal at 12V is supplied to the input terminal 11, the source voltage of transistor Q12, i.e., the gate voltage and drain voltage of transistor Q11, is 11V, and the source voltage of transistor Q13, i.e., the gate voltage and drain voltage of transistor Q12, is 10V. A potential difference between the gate and source of transistor Q11 is 1V, and the potential difference between the the gate and source of transistor Q12 also is 1V. Therefore, if a voltage of 12V is applied to the input terminal 11, the gate insulating films of transistors Q11 and Q12 will not be damaged. The gate of transistor Q13 has been supplied with power source voltage VC, i.e., 5V, and its source is at 10V. Therefore, the potential difference between the gate and source of transistor Q13 is only 5V, and therefore the gate insulating film of this transistor Q13 will not be damaged too.

The voltage at node A is determined by the ratio of conductance of transistors Q11 to Q13 and that of transistor Q14. When 12V is applied to input terminal 11, current flows from input terminal 11 to the ground terminal through transistors Q11 to Q14. Consequently, the actual source voltages of transistors Q12 and Q13 are lower than 11V and 10V, respectively. The voltage at node A is lower than 10V by the transistor Q14. Accordingly, the voltage applied to the gates of P- and N-channel enhancement mode MOS transistors Q21 and Q22 becomes lower than 10V. So, the gate insulating films of those transistors are not damaged. The voltage at node A may be set at any voltage lower than 10V by changing the conductance of transistor Q14.

As can be seen from the foregoing description, in the high voltage detecting circuit 14 as described above, when a high voltage test mode setting voltage is applied to input terminal 11, the gate insulating films of the transistors contained therein will not be damaged.

The P-channel MOS transistors Q11 and Q12 may be substituted by N-channel MOS transistors of which the gate and drain are interconnected. Specifically, input terminal 11 is connected to the drain and gate of first N channel MOS transistor, and the source of the first transistor is connected to the drain and gate of the second N channel MOS transistor. The source of the second transistor is connected to the source of P channel MOS transistor Q13. The well regions of P channel MOS transistors Q11 and Q12 are separated from each other. With such a connection of the first and second transistors, since there is no need to separate well regions of those transistors, an area which is occupied by the high voltage detection circuit 14 in the semiconductor circuit is reduced.

Figure 2:
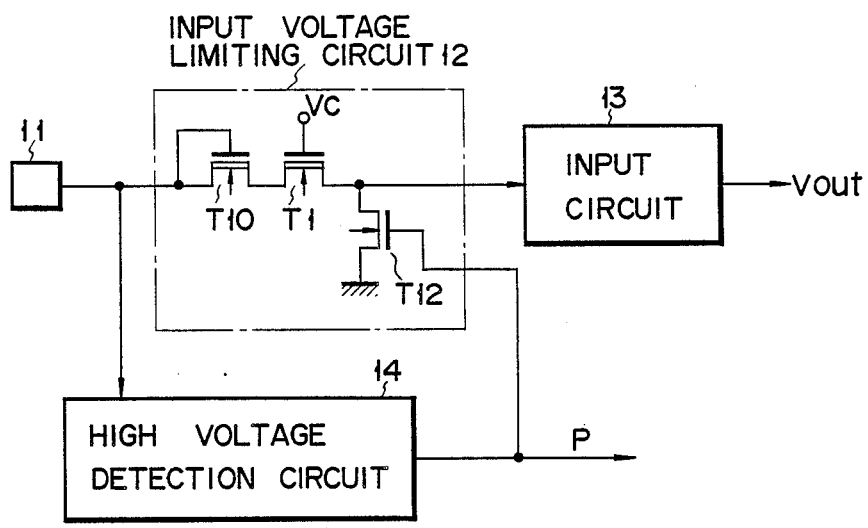
FIG. 2 is a circuit diagram showing a semiconductor integrated circuit according to a second embodiment of the present invention, in which an additional voltage limiting circuit is used.

FIG. 2 shows a second embodiment of the present invention, in which the invention is applied to a semiconductor integrated circuit whose MOS transistors have thinner gate insulating films. A major difference of the circuit arrangement of FIG. 2 from that of FIG. 1 resides in the input voltage limiting circuit 12.

Input voltage limiting circuit 12 in FIG. 2, includes N channel depletion mode MOS transistor T10 and N channel enhancement mode MOS transistor T12, in addition to N channel depletion mode MOS transistor T1. The drain of transistor T10 is connected to input terminal 11, and the gate and drain of the transistor are interconnected. The source of transistor T10 is connected to the drain of transistor T1. The gate of this transistor T1 is connected to the power source voltage VC terminal and its source is connected to the input node of input circuit 13. The drain of transistor T12 is connected to the source of transistor T1 and the source of transistor T12 is connected to the ground terminal. The gate of transistor T12 is supplied with detection signal P of high voltage detection circuit 14. Transistor T12 is switched by the detection signal P of high voltage detection circuit 14.

When the high voltage test mode setting signal is applied to input terminal 11, the detection signal P of the circuit 14 becomes a logic "1", so that transistor T12 is turned on. In an ON state of transistor T12, an input voltage applied to input circuit 13 may be set at an appropriately low voltage as determined by the ratio of conductance of each of transistors T10, T1 and T12. A voltage at a connection point of transistors T10 and T1 may also be selected to be a small voltage to such an extent as to prevent the breakdown of the gate insulating films of transistors T10 and T1. The selection is made by appropriately selecting the conductance of each of transistors T10, T1 and T12.

In the second embodiment, the turning on of transistor T12 is slightly delayed from the instant that a high voltage test mode setting signal is applied to input terminal 11. The delay time is equal to the response time of high voltage detection circuit 14, that is the period from the instant that the test mode setting signal is applied to input terminal 11 until detection signal P becomes a logic "1". During this period of delay, application of the voltage of VC−Vth1 to input circuit 13 continues. However, the breakdown of the gate insulating film is dependent on time. In other words, a relatively long time application of a high voltage is required for the breakdown of the gate insulating film. This is known as TDDB (Time Dependent Dielectric Breakdown). Therefore, the input voltage limiting circuit 12 shown in FIG. 2 may prevent the gate insulating film breakdown in the input circuit 13.

In the input voltage limiting circuit 12, the voltage applied to the gate of N channel depletion mode MOS transistor T1 is not always the power source voltage VC, but may be any voltage lower than that. The N channel depletion mode MOS transistor T1 may be replaced by an N channel enhancement mode MOS transistor. While transistors T10 and T1 are used in input voltage limiting circuit 12, either of them and transistor T12 may be used.

Figure 3:
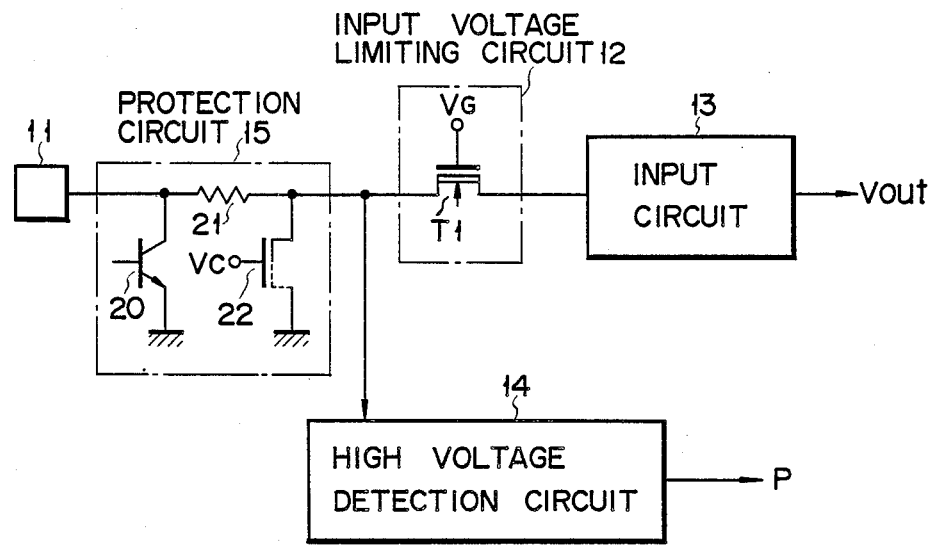
FIG. 3 is a circuit diagram showing a semiconductor integrated circuit according to a third embodiment of the present invention, in which an electrostatic discharge protection circuit is additionally used.

A third embodiment of the present invention is illustrated in FIG. 3. This semiconductor integrated circuit is equivalent to the circuit arrangement of FIG. 1 with an electrostatic discharge protection circuit 15 for protecting the integrated circuit from electrostatic discharge. The protection circuit 15 comprises NPN transistor 20, resistor 21, and gate controlled diode 22.

Figures 4A, 4B:
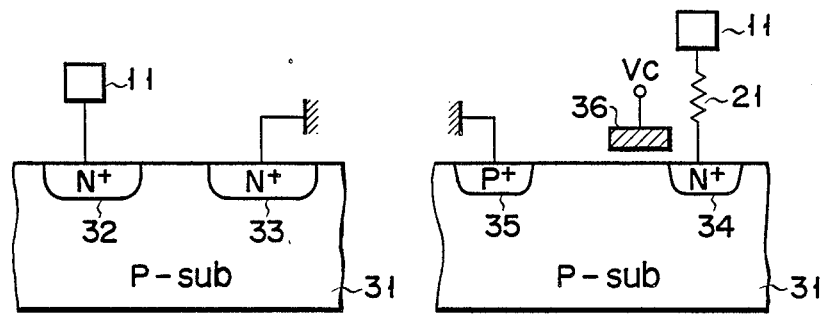
FIG. 4A is a cross sectional view showing the structure of an NPN transistor contained in the input protection circuit used in the integrated circuit shown in FIG. 1.
FIG. 4B is a sectional view showing the structure of a gate controlled diode contained in the input protection circuit used in the integrated circuit shown in FIG. 1.

As shown in FIG. 4A, NPN transistor 20 is made up of a pair of N+ semiconductor regions 32 and 33 formed in the surface region of P type semiconductor substrate 31; region 32 is connected to input terminal 11, and region 33 is connected to a ground terminal. Substrate 31, and regions 32 and 33 serve as the base, collector and emitter of an NPN transistor 20, respectively. Gate controlled diode 22, as shown in FIG. 4B, includes N+ region 34 and P+ region 35 formed in the surface region of P type semiconductor substrate 31. The region 34 is connected through resistor 21 to input terminal 11, while region 35 is connected to the ground terminal. These regions 34 and 35 serve as the cathode and anode of the gate controlled diode 22. The gate controlled diode 22 further includes gate electrode 36 which overlaps the N+ region 34 through a gate insulating film (not shown). P+ region 35 is located apart from region 34 by a predetermined distance. Gate electrode 36 is connected to the power source voltage VC terminal. When a power source is provided to the integrated circuit system, the power source voltage VC is constantly applied to the gate electrode of diode 22. Therefore, the breakdown voltage of the region 34 is relatively high. When the semiconductor integrated circuit is exposed the electrostatic discharge (ESD), while for example, the semiconductor integrated circuit is being transported or being assembled into a system, the breakdown voltage of N+ region 34 of gate controlled diode 22 is relatively low. It is noted that a voltage exceeding the breakdown voltage of the N+ region 34 cannot be applied to input voltage limiting circuit 12 and high voltage detection circuit 14, and hence the circuit of the lower breakdown voltage is more insensitive to ESD. When the integrated circuit is disconnected from the power source, the power source terminal of the integrated circuit is at the same voltage as the substrate. Hence, the voltage of the gate electrode 36 which is disconnected from the power source is lower than the voltage of the gate electrode 36 to which the power source VC is applied. Therefore, the breakdown voltage of N+ region 34 is lowered, when the integrated circuit is disconnected from the power source.

Thus, only in a situation of high probability of exposure of input terminal 11, to ESD is the breakdown voltage of protection circuit 15 set low, and in the reverse situation, set high.

Therefore, even if a high voltage of the test mode setting signal is applied to input terminal 11, a breakdown of the protection circuit 15 can be prevented, and satisfactory protection against ESD attained. NPN transistor 20 provides a current path for the large current which will be caused at the time of the breakdown of the protection circuit.

It is evident that an electrostatic discharge protection circuit 15 is applicable for the integrated circuit of FIG. 2.

As can be seen from the foregoing description, a further microfabrication of semiconductor elements may be realized without the breakdown of the gate insulating films thereof. Because a great potential difference between the switching threshold of the input circuit and that of the high voltage detection circuit is obtained, the input signal and the high voltage test mode setting signal may be correctly detected.

What is claimed is:

1. A semiconductor integrated circuit comprising:
   an input terminal;
   a first circuit responsive to a signal supplied to said input terminal; and
   an input voltage limiting means for limiting the voltage applied to said first circuit to a predetermined voltage, said input voltage limiting circuit being inserted between said input terminal and said first circuit and said input voltage limiting means comprising an N channel MOS transistor, said MOS transistor having a drain connected to said input terminal, a source connected to said first circuit, and a gate connected to a predetermined voltage.

2. A semiconductor integrated circuit according to claim 1, in which said gate of said N channel MOS transistor is connected to a power source terminal of said semiconductor integrated circuit.

3. A semiconductor integrated circuit according to claim 1, in which said N channel MOS transistor is depletion mode MOS transistor.

4. A semiconductor integrated circuit according to claim 1, further comprising an input protection circuit for electrostatic discharge applied to said input terminal.

5. A semiconductor integrated circuit according to claim 4, in which said input protection circuit comprises an NPN transistor, the NPN transistor having a collector connected to said input terminal, an emitter connected to a power voltage supply terminal, and a base.

6. A semiconductor integrated circuit according to claim 5, in which said input protection circuit further comprises a resistive means between said input terminal and said voltage limiting means, and a gate controlled diode, said gate controlled diode having a gate connected to a power source terminal of said integrated circuit.

7. A semiconductor integrated circuit according to claim 5, in which said base is a substrate of said semiconductor integrated circuit.

8. A semiconductor integrated circuit comprising:
an input terminal;
first and second circuits responsive to a signal supplied to said input terminal, said second circuit having a detecting voltage higher than a detecting voltage of said first circuit for detecting a binary state of said input signal; and
an input voltage limiting means for limiting a voltage applied to said first circuit to a predetermined voltage, said input voltage limiting circuit being inserted between said input terminal and said first circuit and said input voltage limiting means comprising an N channel MOS transistor, said MOS transistor having a drain connected to said input terminal, a source connected to said first circuit, and a gate connected to a predetermined voltage.

9. A semiconductor integrated circuit according to claim 8, in which said gate of said N channel MOS transistor is connected to a power source terminal of said semiconductor integrated circuit.

10. A semiconductor integrated circuit according to claim 8, further comprising an input protection circuit for electrostatic discharge applied to said input terminal.

11. A semiconductor integrated circuit according to claim 10, in which said input protection circuit comprises an NPN transistor, said NPN transistor having a collector connected to said input terminal, and emitter connected to a ground terminal, and a base.

12. A semiconductor integrated circuit according to claim 11, in which said input protection circuit further comprises a resistive means between said input terminal and said voltage limiting means.

13. A semiconductor integrated circuit according to claim 12, in which said input protection circuit further comprises a gate controlled diode having a gate connected to a power source terminal of said integrated circuit.

14. A semiconductor integrated circuit according to claim 8, in which said N channel MOS transistor is a depletion mode MOS transistor.

15. A semiconductor integrated circuit comprising:
an input terminal receiving a first signal of binary "1" or "0" in a first voltage range and a second signal of binary "1" or "0" in a second voltage range, said second voltage range being larger than said first voltage range;
a first circuit for detecting said first signal, and producing a logic signal according to said first signal;
a second circuit for detecting said second signal, a detecting voltage of said second circuit being higher than that of said first circuit, said second circuit producing a detection signal when said second signal is applied to said input terminal; and
an input voltage limiting means for limiting the voltage applied from said input terminal to said first circuit to a predetermined voltage which is lower than said second voltage range, said input voltage limiting means being inserted between said input terminal and said first circuit.

16. A semiconductor integrated circuit according to claim 15, further comprising an input protection circuit for electrostatic discharges applied to said input terminal, said input protection circuit being connected to said input terminal.

17. A semiconductor integrated circuit according to claim 16, in which said second circuit is connected to a node between said input voltage limiting means and said input protection circuit, and said input voltage limiting means comprises a MOS transistor having a drain connected to said node, a source connecting to said first circuit, and a gate connected to a predetermined voltage.

18. A semiconductor integrated circuit comprising:
an input terminal;
first and second circuits responsive to a signal supplied to said input terminal, said second circuit having a detecting voltage higher than a detecting voltage of said first circuit for detecting a binary state of said input signal; and
an input voltage limiting means for limiting a voltage applied to said first circuit to a predetermined voltage, said input voltage limiting circuit being inserted between said input terminal and said first circuit;
wherein said semiconductor integrated circuit is in a test mode when a voltage applied to said input terminal is higher than the detecting voltage of said second circuit.

19. A semiconductor integrated circuit according to claim 18, in which said voltage limiting means limits the voltage applied to said first circuit to a predetermined voltage lower than the voltage applied to said input terminal in said test mode.

20. A semiconductor integrated circuit according to claim 18, in which the voltage applied to said input terminal is lower than the detecting voltage of said second circuit except said test mode.

21. A semiconductor integrated circuit comprising:
an input terminal;
first and second circuits responsive to a signal supplied to said input terminal, said second circuit having a detecting voltage higher than a detecting voltage of said first circuit for detecting a binary state of said input signal; and
an input voltage limiting means for limiting a voltage applied to said first circuit to a predetermined voltage, said input voltage limiting circuit being inserted between said input terminal and said first circuit;
wherein said input voltage limiting means comprises first and second N channel MOS transistors, said first N channel MOS transistor having a drain connected to said input terminal, a source connected to said first circuit and a gate connected to a predetermined voltage, and said second N channel MOS transistor having a drain connected to the source of said first transistor, a source connected to a ground terminal, and a gate connected to a logic signal output from said second circuit, said second transistor being controlled by said logic output signal of said second circuit.

* * * * *

UNITED STATES PATENT AND TRADEMARK OFFICE
CERTIFICATE OF CORRECTION

PATENT NO. : 4,937,700
DATED : June 26, 1990
INVENTOR(S) : Hiroshi Iwahashi

It is certified that error appears in the above-identified patent and that said Letters Patent is hereby corrected as shown below:

In the title page under Foreign Application Priority data, "62-63739" should be --63-739--.

Signed and Sealed this

Sixth Day of October, 1992

Attest:

DOUGLAS B. COMER

*Attesting Officer*  Acting Commissioner of Patents and Trademarks